United States Patent
Lee et al.

(10) Patent No.: US 10,321,525 B2
(45) Date of Patent: Jun. 11, 2019

(54) CONTROL PANEL AND MICROWAVE OVEN

(71) Applicant: SAMSUNG ELECTRONICS CO., LTD., Suwon-si, Gyeonggi-do (KR)

(72) Inventors: Chul Woo Lee, Suwon-si (KR); Sun Ki Kim, Suwon-si (KR); Jin Seong Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 616 days.

(21) Appl. No.: 14/555,842

(22) Filed: Nov. 28, 2014

(65) Prior Publication Data

US 2015/0156825 A1 Jun. 4, 2015

(30) Foreign Application Priority Data

Nov. 29, 2013 (KR) ........................ 10-2013-0147385

(51) Int. Cl.
*H05B 6/64* (2006.01)
*H05K 7/02* (2006.01)

(52) U.S. Cl.
CPC .......... *H05B 6/642* (2013.01); *H05B 6/6423* (2013.01); *H05B 6/6426* (2013.01); *H05B 6/6435* (2013.01); *H05K 7/02* (2013.01)

(58) Field of Classification Search
CPC .... H05B 6/642; H05B 6/6423; H05B 6/6426; H05B 6/6435; H05K 7/02

(Continued)

(56) References Cited

U.S. PATENT DOCUMENTS 4,336,569 A * 6/1982 Tsuda ..................... F24C 7/082
                                                    219/702
4,831,226 A * 5/1989 Robeson .............. G05B 19/108
                                                    219/702

(Continued)

FOREIGN PATENT DOCUMENTS

EP     1 441 568 A2    7/2004
EP     1 441 568 A3    9/2007

(Continued)

OTHER PUBLICATIONS

European Office Action dated Jul. 19, 2016 from European Patent Application No. 14195525.2, 26 pages.

(Continued)

*Primary Examiner* — Tu B Hoang
*Assistant Examiner* — Masahiko Muranami
(74) *Attorney, Agent, or Firm* — Staas & Halsey LLP (57) ABSTRACT

A control panel having a tunnel structure of discharging infiltrated moisture, and a microwave oven having the same. The microwave oven includes a cabinet provided with a cooking compartment in which food is heated by microwaves and a machine room divided from the cooking compartment and in which machine parts are installed, a door coupled to a front side of the cooking compartment so as to open and close, and a control panel coupled to a front side of the machine room and provided to allow a function to be selected, wherein the control panel is provided at an inside thereof with at least one tunnel allowing moisture infiltrated into the control panel to pass therethrough so that the moisture is discharged to the outside. The tunnel is formed along an outer peripheral surface of the input unit, thereby preventing device malfunction due to moisture infiltrated into the control panel.

11 Claims, 7 Drawing Sheets

(58) Field of Classification Search
USPC ....... 219/261, 757, 679, 702, 734, 735, 739, 219/743, 756, 763
See application file for complete search history.

(56) References Cited

U.S. PATENT DOCUMENTS

| | | | |
|---|---|---|---|
| 5,834,745 A | | 11/1998 | Aoki et al. |
| 6,111,240 A | * | 8/2000 | Kishimoto ............. G04C 3/001 200/336 |
| 8,299,410 B2 | * | 10/2012 | Hirano ................. H05K 5/0213 219/757 |
| 2007/0116816 A1 | * | 5/2007 | Kim ..................... H05B 6/6441 426/523 |
| 2007/0199804 A1 | * | 8/2007 | Joseph ................. H01H 13/705 200/5 A |
| 2008/0037205 A1 | * | 2/2008 | Arisaka ................ G06F 1/1616 361/679.08 |
| 2008/0264933 A1 | * | 10/2008 | Jeong .................. F24C 15/2092 219/679 |
| 2012/0236227 A1 | * | 9/2012 | Jang .................. G02F 1/133308 349/58 |
| 2012/0281374 A1 | * | 11/2012 | Lee ...................... H05B 6/6435 361/756 |

FOREIGN PATENT DOCUMENTS

| | | | | |
|---|---|---|---|---|
| EP | 2 527 746 A1 | | 11/2012 | |
| GB | 2331218 A | * | 5/1999 | ............... H05B 6/80 |
| JP | 59-200134 | | 11/1984 | |
| KR | 1998-060406 | | 11/1998 | |
| KR | 1999-0030579 | | 7/1999 | |

OTHER PUBLICATIONS

English Search Report dated Apr. 23, 2015 in corresponding European Patent Application No. 14195525.2.

* cited by examiner

CONTROL PANEL AND MICROWAVE OVEN

CROSS-REFERENCE TO RELATED APPLICATIONS

This application claims the benefit of Korean Patent Application No. 10-2013-0147385, filed on Nov. 29, 2013 in the Korean Intellectual Property Office, the disclosure of which is incorporated herein by reference.

BACKGROUND

1. Field

Embodiments of the present disclosure relate to a control panel and a microwave oven having the same, and more particularly, to a control panel having a tunnel structure of discharging infiltrated moisture and a microwave oven having the same.

2. Description of the Related Art

A microwave oven is an appliance that heats food from inside out by radiating radio-frequency waves to the foods. The microwave oven has benefits including significantly reducing the time for cooking foods, and destroying less nutrients in foods during cooking, defrosting and heating up foods. In addition, the foods can be cooked while kept in a container.

In recent years, there has been an Over-The-Range (OTR) provided in the form of a microwave oven having a hood function combined therewith. The OTR-type microwave oven, which is installed on a wall, enhances the convenience and efficiency in cooking foods while requiring minimal installation space. Such a microwave oven is installed above a cooker, such as a gas range or a cooktop installed on a counter in a general kitchen.

Accordingly, vapor or moisture generated during a cooking process of a cooker located below the microwave oven rises upward, and may affect the microwave oven. In particular, when moisture is infiltrated into a control panel attached to a front surface of the microwave oven, a malfunction, such as erroneous operation of an input unit, may occur. Accordingly, there is a need of a structure of preventing moisture from being infiltrated or a structure of discharging moisture.

SUMMARY

Therefore, it is an aspect of the present disclosure to provide a control panel capable of preventing moisture generated from a cooker located below an OTR product from being infiltrated into the OTR product, and a microwave oven having the same.

It is another aspect of the present disclosure to provide a control panel capable of prevent malfunction of an input unit by discharging moisture to the outside using a tunnel structure, and a microwave oven having the same.

Additional aspects of the disclosure will be set forth in part in the description which follows and, in part, will be apparent from the description, or may be learned by practice of the disclosure.

In accordance with an aspect of the present disclosure, a microwave oven includes a cabinet, a door and a control panel. The cabinet may be provided with a cooking compartment in which food is heated by microwaves and a machine room divided from the cooking compartment and in which machine parts are installed. The door may be coupled to a front side of the cooking compartment so as to open and close. The control panel may be coupled to a front side of the machine room and provided to allow a function to be selected. The control panel may be provided at an inside thereof with at least one tunnel allow moisture infiltrated into the control panel to pass therethrough so that the moisture is discharged to the outside.

The control panel may include a main body and an input unit attached to a front surface of the main body, wherein the at least one tunnel may be provided on the front surface of the main body adjoining the input unit.

The at least one tunnel may be formed along an outer peripheral surface of the input unit.

The input unit may include a keyboard on which a button part provided to allow a function to be selected is printed and a pattern board attached to a rear surface of the keyboard.

The at least one tunnel may include a first tunnel formed along an outer peripheral surface of the keyboard and a second tunnel formed along an outer peripheral surface of the pattern board.

The keyboard may be attached to a position inwardly spaced apart by a predetermined interval from an outer peripheral surface formed by the front surface of the main body. The pattern board may be attached to a position inwardly spaced apart by a predetermined interval from an outer peripheral surface formed by the rear surface of the keyboard.

The front surface of the main body may be recessed in a plurality of steps such that the keyboard and the pattern board are installed on the front surface.

The front surface of the main body may include a first surface forming an external appearance of the main body, a second surface recessed from the first surface and allowing the keyboard to be installed thereon and a third surface recessed from the second surface and allowing the pattern board to be installed thereon.

The at least one tunnel may include a first tunnel formed by recessing an outer peripheral surface of the second surface adjoining the first surface, and a second tunnel formed by recessing an outer peripheral surface of the third surface adjoining the second surface.

The at least one tunnel may include at least one discharge hole allowing moisture infiltrated into the control panel to be discharged to the outside.

The first tunnel and the second tunnel may include at least one discharge hole that is open toward a rear surface of the control panel such that moisture introduced from a front surface of the control panel through a gap between the input unit and the main body is discharged through the rear surface of the control panel.

The at least one discharge hole may be located at a lower portion of the first tunnel and the second tunnel.

A lower surface of an opening forming the least one discharge hole may be provided to incline toward a lower portion of a rear surface of the main body such that moisture is discharged downward.

The at least one tunnel may include at least one ground port allowing a ground line attached to the input unit to pass therethrough.

In accordance with another aspect of the present disclosure, a microwave oven installed above a cooker includes a cabinet, a door, a hood panel and a control panel. The cabinet may be provided at an inside thereof with a cooing compartment and a machine room, the cabinet having a front surface thereof open. The door may be movably coupled to a front surface of the cabinet, to form the cooking compartment. The hood panel may be attached to a lower surface of the cabinet, and allow fumes generated from the cooker to be introduced thereinto. The control panel may be coupled to a front surface of the cabinet, and include a main body and an input unit attached to a front surface of the main body. The main body may include at least one tunnel formed along an outer peripheral surface of the input unit such that moisture generated from the cooker and infiltrated into the control panel is discharged to the outside.

The input unit may include a keyboard having an area smaller than the front surface of the main body, and a pattern board having an area smaller than an outer surface of the keyboard.

The pattern board may be attached to a position inwardly spaced apart by a predetermined interval from an outer peripheral surface formed by the front surface of the main body; and the keyboard may be attached to the front surface of the main body to cover the pattern board.

The at least one tunnel may include a first tunnel formed along an outer peripheral surface of the keyboard and a second tunnel formed along an outer peripheral surface of the pattern board.

In accordance with another aspect of the present disclosure, a control panel includes a main body, an input unit and a circuit board. The input unit may be attached to a front surface of the main body, and provided to allow a function to be selected. The circuit board may be attached to a rear surface of the main body, and on which electronic components are mounted to receive a result of the function selected from the input unit. The main body may include at least one tunnel that extends while being inwardly recessed such that moisture infiltrated through a gap between the input unit and the main body is discharged to the outside.

The at least one tunnel may be formed along an outer peripheral surface of the input unit.

The at least one tunnel may include at least one discharge hole allowing moisture to be discharged to the outside.

The at least one discharge port may be provided to incline toward a lower portion of the rear surface of the main body such that moisture infiltrated through the front surface of the main body to be discharged through the rear surface of the main body along the at least one discharge hole

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Reference will now be made in detail to the embodiments of the present disclosure, examples of which are illustrated in the accompanying drawings, wherein like reference numerals refer to like elements throughout.

Figure 1:
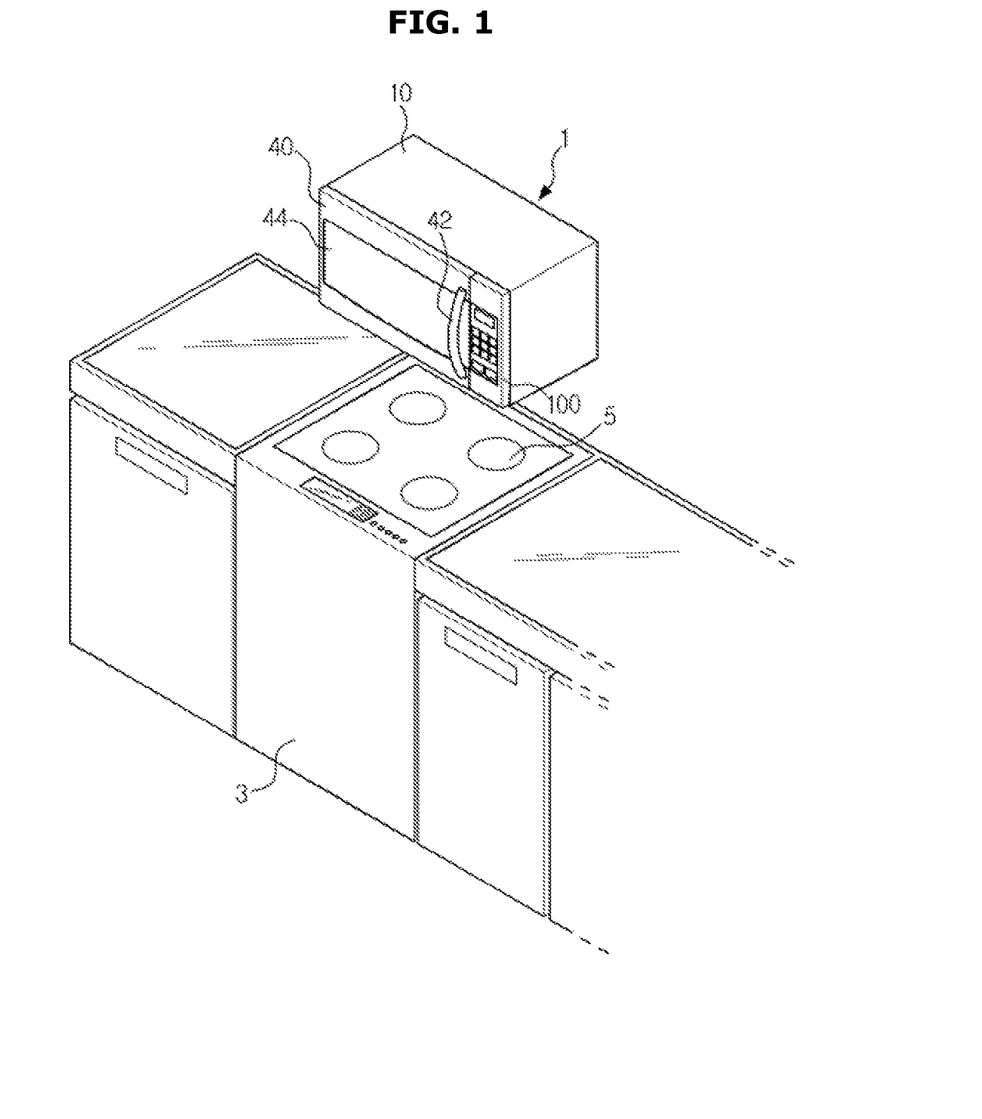
FIG. 1 is a view illustrating a microwave oven in accordance with an embodiment of the present disclosure, which is being installed.

FIG. 1 is a view illustrating a microwave oven in accordance with an embodiment of the present disclosure, which is being installed.

A microwave range 1 according to the present disclosure may be installed above a cooker 3. The microwave range 1 is installed on a wall and thus referred to as a wall mount type microwave oven, a combination hood and microwave range, and an Over The Range (OTR) product.

The microwave range 1 includes a cabinet 10 provided at an inside thereof with a cooking compartment (11 in FIG. 2) and a machine room (12 in FIG. 2), and a door 40 and a control panel 100 that are coupled to a front surface of the cabinet 10. The cabinet 10 is located above the cooker 3, and fixed with a rear surface thereof coupled to a wall. In this case, a microwave range 1 may be affected by moisture rising upward when food is cooked by the cooker 3. In particular, a heating plate 5 located at a lower side of the control panel 100 serves as a main heating plate of the cooker 3, and may generate a great amount of heat and vapor.

Figure 2:
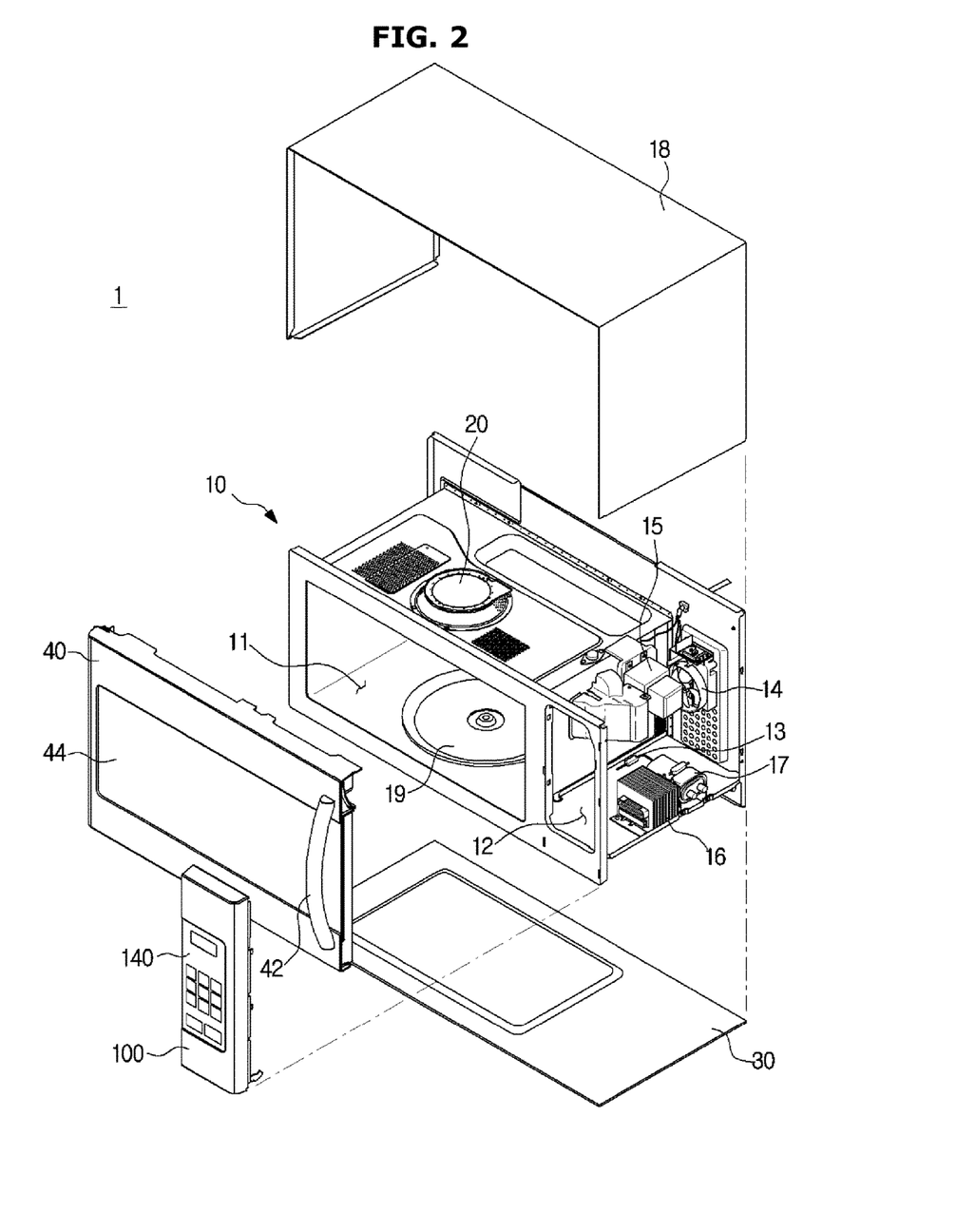
FIG. 2 is an exploded perspective view illustrating a microwave oven in accordance with an embodiment of the present disclosure.

FIG. 2 is an exploded perspective view illustrating the microwave oven 1 in accordance with an embodiment of the present disclosure.

The cabinet 10 is provided with the cooking compartment 11 having a front surface thereof open such that food is introduced therethrough, and a machine room 12 having a front surface thereof open such that various machine parts are installed therethrough, the cooking compartment 11 divided from the machine room 12. The cabinet 10 may be coupled to an upper cover 18 covering an upper surface and both side surfaces, to protect various parts installed on the cabinet 10. A hood panel 30 is attached to a lower surface of the cabinet 10 such that exhaust gas generated from the cooker 3 is introduced through the hood panel 30.

The door 40 having one side thereof hinged to a front surface of the cabinet 10 is installed on the front surface of the cabinet 10. The door 40 is movably coupled to the cooking compartment 11 having a front surface thereof open, thereby forming the cooking compartment 11 in which foods are heated. The cooking compartment 11 is provided at an inside thereof with a tray 19 on which foods are mounted, and a motor (not shown) is installed at a lower side of the tray 19, so that the foods are rotated together with the tray 19.

The control panel 100 is coupled to a front surface of the machine room 12, to allow the power of microwaves and the operating time to be selected according to the amount of foods. The control panel 100 is provided at the front surface thereof with an input unit 140 allowing a function to be selected, and according to the function selected, various machine parts in the machine room 12 operate.

Installed in the machine room 12 are a magnetron 15 to generate microwaves to be radiated to the cooking compartment 20, and a high voltage transformer (HVT) 16, a high voltage condenser 17, and a high voltage diode 13 forming a driving circuit to drive the magnetron 15. A cooling fan 14 is provided at a rear side of the machine room 12 to cool the various machine parts in the machine room 12 by suctioning outside air.

The HVT 16 outputs a high voltage of about 2000V by receiving a commercial alternating current (AC 110V or 220V), and the output voltage is boosted to about 4000V by the high voltage condenser 17 and the high voltage diode 13, and transmitted to the magnetron 15. The magnetron 15 generates microwaves of about 2450 MHz.

The operation of the microwave oven 1 is as follows. First, food is placed on the cooking compartment 11, and by operating the microwave range 1 through the control panel 100, a commercial power source is applied to the HVT 16, and the HVT 16 raises the commercial power source to about 2000V. The voltage is boosted by the high voltage condenser 17 and the high voltage diode 13 to a high voltage of about 4000V, and transmitted to the magnetron 15. The magnetron 15 generates microwaves of 2450 MHz from the high voltage power, and radiates the microwaves, so that foods are cooked by the microwaves.

Figure 3:
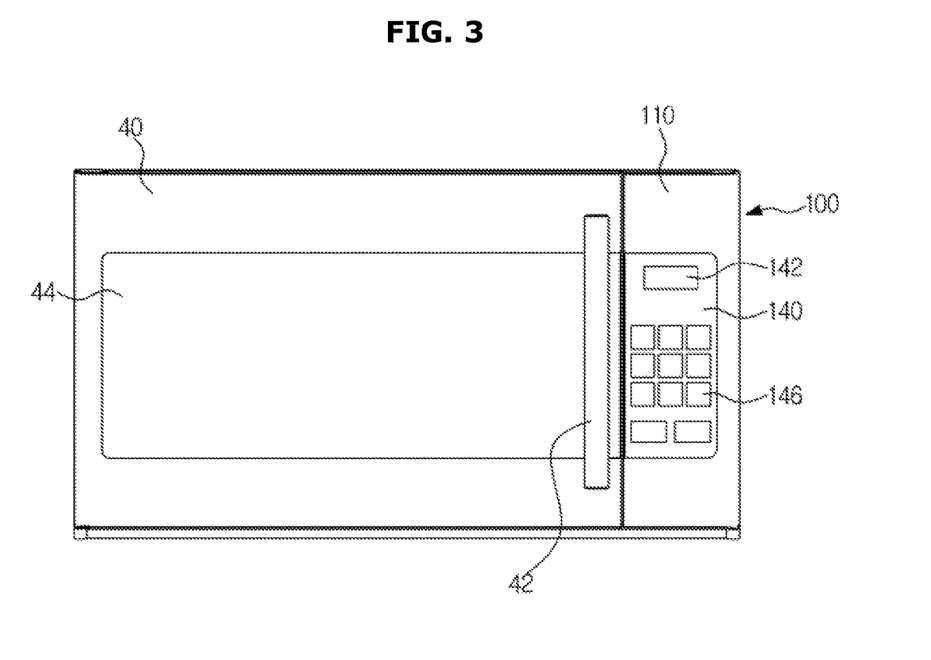
FIG. 3 is a view illustrating a front surface of a microwave oven in accordance with an embodiment of the present disclosure.
Figure 4:
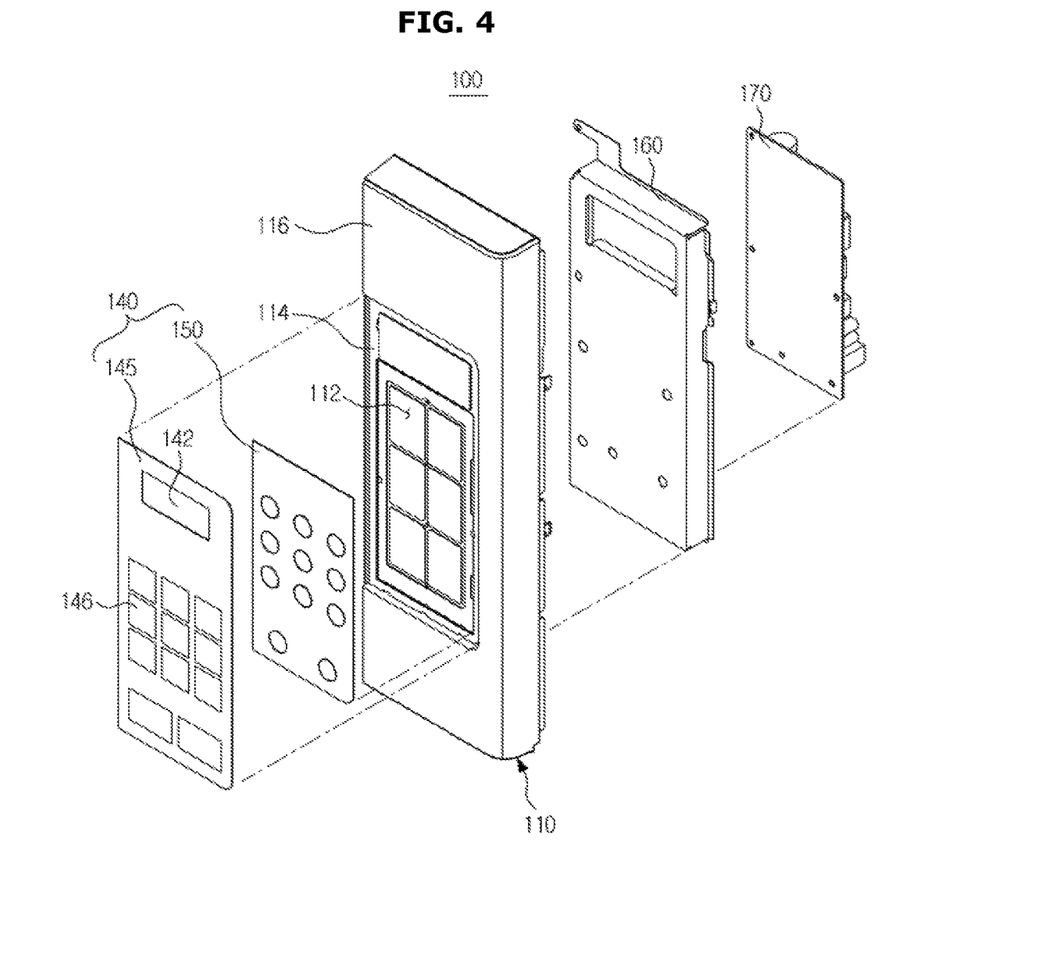
FIG. 4 is an exploded view illustrating a control panel in accordance with an embodiment of the present disclosure.

FIG. 3 is a view illustrating a front surface of the microwave oven 3 in accordance with an embodiment of the present disclosure, and FIG. 4 is an exploded view illustrating a control panel 100 in accordance with an embodiment of the present disclosure.

The door 40 and the control panel 100 that are coupled to the front surface of the cabinet 10 are disposed side by side while making contact with each other at one side thereof. The door 40 is provided at a front surface thereof with a window 44 allowing a user to check the state of the food during cooking. The door 40 is hinged at one side thereof to the cabinet 10, and the other side of the door 40 is provided with a grip 42 allowing a user to easily pivot the door 40. By pulling the grip 42 forward to pivot the door 40, the cooking compartment 11 is open and closed.

The control panel 100 includes a main body 110, an input unit 140 attached to a front surface of the main body 110, and a circuit board 170 attached to a rear surface of the main body 110. As shown in FIG. 3, the input unit 140 is provided to be connected to the window 44 of the door 40, thereby improving the aesthetic quality of the microwave oven 1.

The circuit board 170 is provided to mount electronic parts to receive a function selected by the input unit 140. The circuit board 170 is insertedly coupled to a cover 160, and the cover 160 is coupled to a rear surface of the main body 110, so that the circuit board 170 is attached to the rear surface of the main body 110.

The input unit 140 may include a keyboard 145 and a pattern board 150 attached to a rear surface of the keyboard 145. The keyboard 145 includes a button part 146 printed such that a function is selected, and a display part 142 displaying an operation state of the microwave oven 1 and a setting function. The pattern board 150 is attached to a rear surface of the button part 146, and provided in the form corresponding to a shape of the button part 146.

The input unit 145 is provided in a membrane type in which a signal based on a pressure is transmitted and operates according to a selected function. The membrane type microwave oven 1 operates such that a cooking name and a cooking time are randomly input, and as a cooking key is pressed, a set cooking mode is automatically performed. That is, when a user applies a pressure to the keyboard 145, the keyboard 145 comes into contact with the pattern board 150, and a signal is transmitted, so that the microwave oven 1 operates.

The keyboard 145 has an area smaller than the front surface of the main body 110, and the pattern board 150 has an area smaller than an outer surface of the keyboard 145. That is, the keyboard 145 is attached to a position inwardly spaced apart by a predetermined interval from an outer peripheral surface formed by the front surface of the main body 110. In addition, the pattern board 150 is attached to a position inwardly spaced apart by a predetermined interval from an outer peripheral surface formed by the rear surface of the keyboard 145. Accordingly, the pattern board 150 is attached to the front surface of the main body 110 first, and then the keyboard 145 is attached to the front surface of the main body 110 to cover the front surface of the pattern board 150.

The front surface of the main body 110 is recessed in a plurality of steps such that the keyboard 145 and the pattern board 150 are installed on the front surface of the main body 110. When a surface forming the external appearance of the front surface of the main body 110 is a first surface 116, the keyboard 145 and the pattern board 150 are installed on a second surface 114 and a third surface 112, respectively, that are recessed from the first surface 116. The second surface 114 is obtained by backwardly recessing a predetermined interval from the first surface 116 while corresponding to the area of the keyboard 145, and the third surface 112 is obtained by backwardly recessing a predetermined interval from the second surface 114 while corresponding to the area of the pattern board 145.

Accordingly, the pattern board 150 and the keyboard 145 attached to the front surface of the main body 110 provided with recesses may allow the control panel 100 to have a smooth external appearance. However, when the pattern board 150 and the keyboard 145 are attached to the front surface of the main body 110, a gap may occur at a region around between outer peripheral surfaces of the pattern board 150 and the keyboard 145. Due to the gap, moisture included in air may be infiltrated into the control panel 100.

Figure 5:
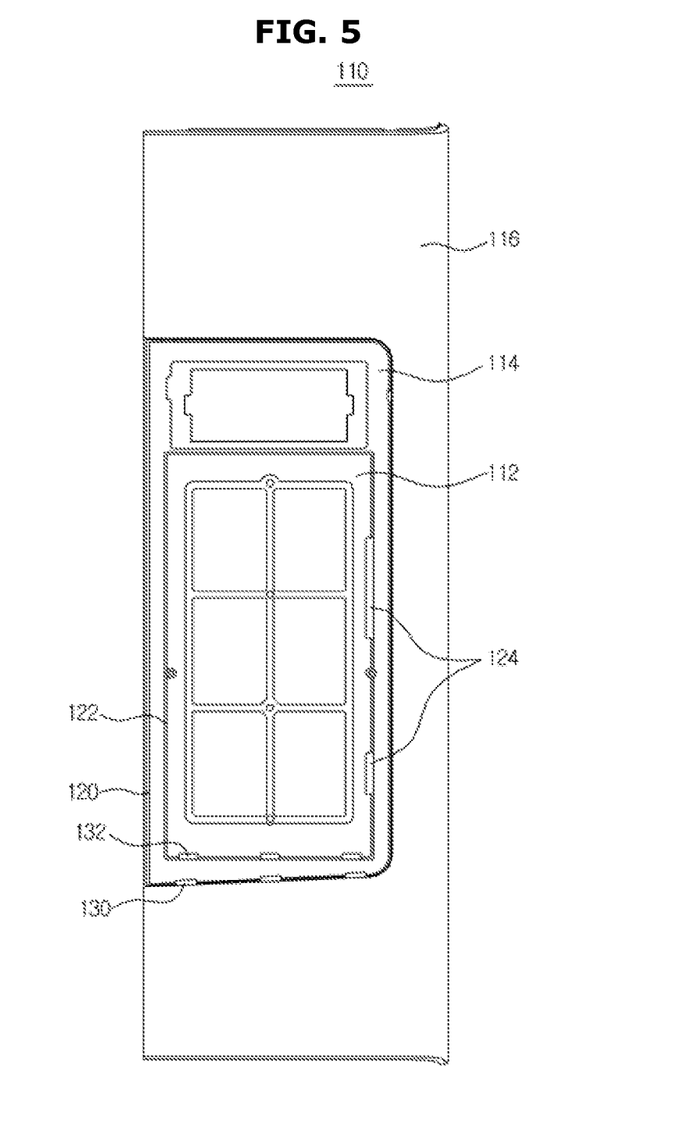
FIGS. 5 and 6 are views illustrating a front surface and a rear surface of a main body of a control panel in accordance with an embodiment of the present disclosure.
Figure 6:
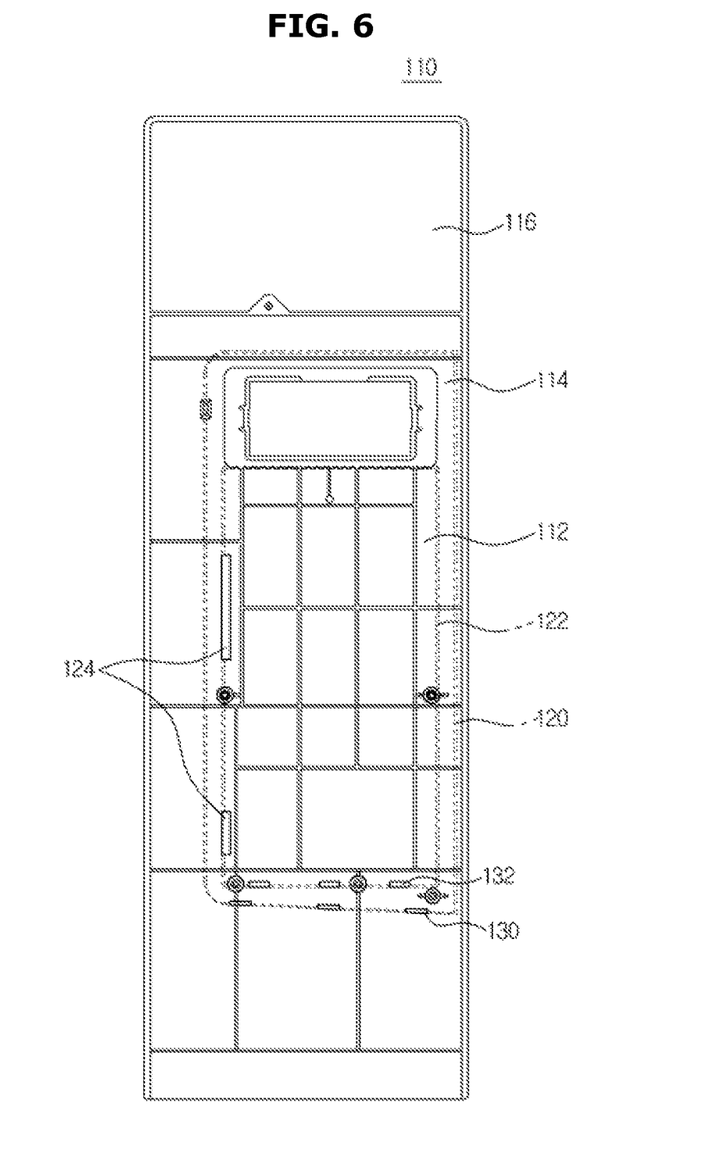
Figure 7:
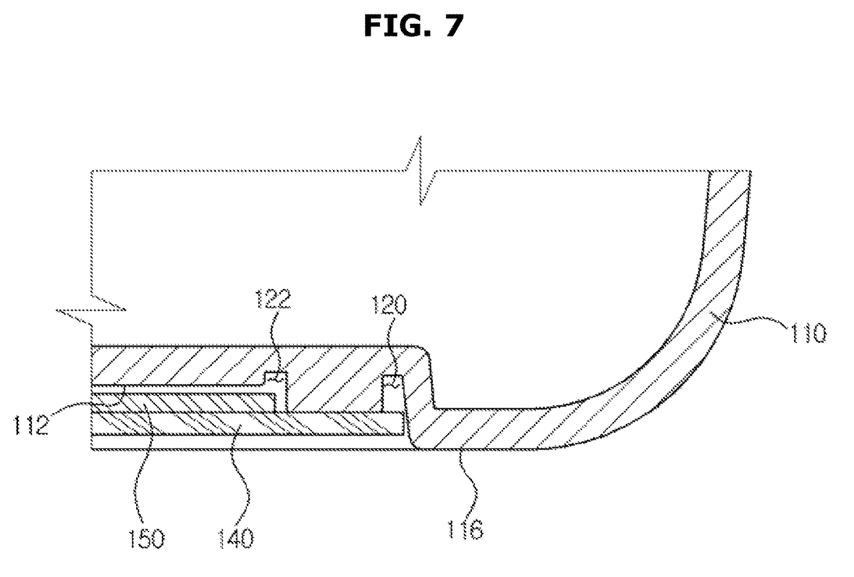
FIG. 7 is a cross sectional view illustrating a main body of a control panel in accordance with an embodiment of the present disclosure.

FIGS. 5 and 6 are views illustrating a front surface and a rear surface of the main body 110 of the control panel 100 of in accordance with an embodiment of the present disclosure, and FIG. 7 is a cross sectional view illustrating the main body 110 of the control panel 100 in accordance with an embodiment of the present disclosure.

The main body 110 may include at least one tunnel 120 and 122 allowing moisture infiltrated into the control panel 100 through the gap between the front surface of the main body 110 and the input unit 140 to be discharged to the outside. The at least one tunnel 120 and 122 is formed as a predetermined path allowing moisture to pass therethrough. The at least one tunnel 120 and 122 may be provided on the front surface of the main body 110 making contact with the input unit 140.

The at least one tunnel 120 and 122 may be obtained by backwardly recessing the front surface of the main body 110. As shown in FIG. 5, the at least one tunnel 120 and 122 may be a first tunnel 120 and a second tunnel 122 spaced apart by a predetermined interval from the first tunnel 120. The first tunnel 120 and the second tunnel 122 may be formed along the outer peripheral surface of the input unit 140.

The first tunnel 120 is formed along the outer peripheral surface of the keyboard 145, and the second tunnel 122 is formed along the outer peripheral surface of the pattern board 150. As shown in FIG. 7, the first tunnel 120 is formed by recessing an outer peripheral surface of the second surface 114 adjoining the first surface 116, and the second tunnel 122 is formed by recessing an outer peripheral surface of the third surface 112 adjoining the second surface 114. The keyboard 145 and the pattern board 150 are coupled to the second surface 114 and the third surface 112, respectively, and moisture infiltrated into the gap may move along the first tunnel 120 and the second tunnel 122.

The first tunnel 120 and the second tunnel 122 may include at least one discharge hole 130 and 132 allowing moisture infiltrated into the tunnels 120 and 122 to be discharged to the outside. As shown in FIG. 6, the first tunnel 120 and the second tunnel 122 include at least one discharge hole 130 and 132 that is open toward a rear surface of the control panel 100. Accordingly, moisture introduced from the front surface of the control panel 100 through the gap between the input unit 140 and the main body 110 is discharged through the rear surface of the control panel 100.

The at least one discharge hole 130 and 132 may be provided in plurality thereof at lower portions of the first tunnel 120 and the second tunnel 122. A lower surface of an opening forming the least one discharge hole 130 and 132 is provided to incline toward a lower portion of a rear surface of the main body 110 such that moisture is discharged downward. Accordingly, moisture moving along the first tunnel 120 and the second tunnel 122 may be discharged by gravity through the at least one discharge hole 130 and 132 provided at the lower portion.

The main body 110 may include at least one ground port 124 allowing a ground line attached to the input unit 140 to pass therethrough. The ground line 124 may be provided on the first tunnel 120 or the second tunnel 122 and used as a discharge hole allowing moisture to be discharged therethrough. As shown in FIGS. 5 and 6, the ground line 124 is located at a side of the second tunnel 122, and open toward the rear surface of the main body 110.

As is apparent from the above, moisture infiltrated into the control panel can pass through a tunnel formed along an outer peripheral surface of the input unit of the control panel.

Device malfunction due to moisture can be prevented by forming a plurality of tunnels spaced apart from each other by a predetermined interval.

Although a few embodiments of the present disclosure have been shown and described, it would be appreciated by those skilled in the art that changes may be made in these embodiments without departing from the principles and spirit of the disclosure, the scope of which is defined in the claims and their equivalents.

What is claimed is:

1. A microwave oven comprising:
    a cabinet provided with a cooking compartment in which an object to be heated is inserted thereinto and a machine compartment;
    a door coupled to a front side of the cooking compartment so as to open and close an opening of the cooking compartment; and
    a control panel coupled to a front side of the machine compartment, the control panel including a main body and a user interface attached to a front surface of the main body, the user interface including a keyboard on which at least one button corresponding to a function to be selected is printed and a pattern board attached to a rear surface of the keyboard,
    wherein the control panel is provided at an inside thereof with a first tunnel continuously formed along an outer peripheral surface of the keyboard and a second tunnel continuously formed along an outer peripheral surface of the pattern board so that moisture infiltrated into the control panel is collected in the first tunnel and the second tunnel, and
    the first tunnel and the second tunnel each include at least one discharge hole that is open toward a rear surface of the main body to allow the moisture collected in the first tunnel and the moisture collected in the second tunnel to be moved along the first tunnel and the second tunnel, respectively, and to be discharged to the outside through the respective discharge holes.

2. The microwave oven of claim 1, wherein the user interface is attached to a position inwardly spaced apart by a predetermined interval from an outer peripheral surface formed by the front surface of the main body; and
    the pattern board is attached to a position inwardly spaced apart by a predetermined interval from an outer peripheral surface formed by the rear surface of the keyboard.

3. The microwave oven of claim 1, wherein the front surface of the main body is recessed in a plurality of steps such that the keyboard and the pattern board are installed on the front surface.

4. The microwave oven of claim 1, wherein the front surface of the main body includes a first surface forming an external appearance of the main body, a second surface recessed from the first surface and allowing the keyboard to be installed thereon, and a third surface recessed from the second surface and allowing the pattern board to be installed thereon.

5. The microwave oven of claim 4, wherein the first tunnel is formed by recessing an outer peripheral surface of the second surface adjoining the first surface, and
    the second tunnel is formed by recessing an outer peripheral surface of the third surface adjoining the second surface.

6. The microwave oven of claim 1, wherein the at least one discharge hole of each of the first tunnel and the second tunnel is located at a lower portion of the first tunnel and the second tunnel, respectively.

7. The microwave oven of claim 1, wherein the first tunnel or the second tunnel includes at least one ground port allowing a ground line attached to the user interface to pass therethrough.

8. A microwave oven installable above a cooker, the microwave oven comprising:
    a cabinet provided at an inside thereof with a cooking compartment and a machine compartment;
    a door movably coupled to a front surface of the cabinet, to open and close an opening of the cooking compartment;
    a hood panel attached to a lower surface of the cabinet, and allowing fumes generated from the cooker to be introduced thereinto; and
    a control panel coupled to a front surface of the cabinet, the control panel including a main body and an user interface attached to a front surface of the main body, the user interface including a keyboard on which at least one button is provided to allow a corresponding function to be selected is printed and a pattern board attached to a rear surface of the keyboard,
    wherein the main body includes a first tunnel continuously formed along an outer peripheral surface of the keyboard and a second tunnel continuously formed along an outer peripheral surface of the pattern board so that moisture infiltrated into the control panel is collected in the first tunnel and the second tunnel, and
    wherein the first tunnel and the second tunnel each include at least one discharge hole that is open toward a rear surface of the main body so that moisture collected in the first tunnel and the moisture collected in the second tunnel from the cooker to be moved along the first tunnel and the second tunnel, respectively, and to be discharged to the outside.

9. The microwave oven of claim 8, wherein the keyboard has an area smaller than the front surface of the main body, and the pattern board has an area smaller than an outer surface of the keyboard.

10. The microwave oven of claim 9, wherein the pattern board is attached to a position inwardly spaced apart by a predetermined interval from an outer peripheral surface formed by the front surface of the main body; and the keyboard is attached to the front surface of the main body to cover the pattern board.

11. The microwave oven of claim 10, wherein the first tunnel is formed along an outer peripheral surface of the keyboard and the second tunnel is formed along an outer peripheral surface of the pattern board.

\* \* \* \* \*